US006909351B2

(12) United States Patent
Gernert et al.

(10) Patent No.: US 6,909,351 B2
(45) Date of Patent: Jun. 21, 2005

(54) IGNITION COIL MODULE

(75) Inventors: Klaus Gernert, Konz (DE); Sami Ruotsalainen, Helsinki (FI); Peter Weyand, Bertrange (LU)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/426,926

(22) Filed: Apr. 30, 2003

(65) Prior Publication Data

US 2004/0041675 A1 Mar. 4, 2004

(Under 37 CFR 1.47)

(30) Foreign Application Priority Data

Jun. 4, 2002 (DE) ........................................ 102 24 762

(51) Int. Cl.$^{7}$ ................................................ H01L 27/02
(52) U.S. Cl. ........................................... 336/90; 336/96
(58) Field of Search ..................... 336/96, 90; 123/634, 123/635, 647

(56) References Cited

U.S. PATENT DOCUMENTS

| | | | | | |
|---|---|---|---|---|---|
| 2,037,845 | A | | 4/1936 | Young | |
| 4,248,201 | A | * | 2/1981 | Tsutsui et al. | 123/647 |
| 5,003,959 | A | * | 4/1991 | Umezaki et al. | 123/647 |
| 5,186,154 | A | * | 2/1993 | Takaishi et al. | 123/634 |
| 5,191,872 | A | * | 3/1993 | Takaishi | 123/647 |
| 5,365,909 | A | * | 11/1994 | Sawazaki et al. | 123/617 |
| 5,485,825 | A | * | 1/1996 | Shimizu et al. | 123/634 |
| 5,558,074 | A | * | 9/1996 | Fukatsu et al. | 123/647 |
| 5,642,253 | A | | 6/1997 | Shreve | |
| 5,781,047 | A | | 7/1998 | Shreve et al. | |
| 6,087,918 | A | | 7/2000 | Henry et al. | |
| 6,119,667 | A | | 9/2000 | Boyer et al. | |
| 6,188,304 | B1 | | 2/2001 | Skinner et al. | |
| 6,215,385 | B1 | | 4/2001 | Ogden | |
| 6,216,679 | B1 | | 4/2001 | Skinner et al. | |
| 6,232,863 | B1 | | 5/2001 | Skinner et al. | |
| 6,276,348 | B1 | | 8/2001 | Skinner et al. | |
| 6,422,225 | B1 | | 7/2002 | Hamer et al. | |
| 6,463,919 | B1 | | 10/2002 | Skinner et al. | |
| 6,522,232 | B2 | | 2/2003 | Paul et al. | |
| 6,556,118 | B1 | | 4/2003 | Skinner | |
| 6,615,811 | B1 | | 9/2003 | Butler, Jr. | |
| 6,622,711 | B1 | | 9/2003 | Skinner et al. | |

FOREIGN PATENT DOCUMENTS

| | | | |
|---|---|---|---|
| DE | 4132153 | A1 | 9/1991 |
| DE | 4214306 | A1 | 4/1992 |

OTHER PUBLICATIONS

Search Report for German Application No. 10224762.5.

* cited by examiner

*Primary Examiner*—Anh Mai
(74) *Attorney, Agent, or Firm*—Jimmy L. Funke

(57) ABSTRACT

With an ignition coil module comprising a coil system which includes a primary winding and a secondary winding and a flux conducting, soft magnetic device to increase and/or to conduct a magnetic flux generated by one of the windings and comprising an electronic component to control the coil system which has an electrical circuit and a heat sink to cool the electronic component, at least one section of the heat sink is connected to a section of the flux conducting device in a thermally conductive manner such that waste heat of the electronic component can be dissipated over the section of the flux conducting device.

11 Claims, 2 Drawing Sheets

IGNITION COIL MODULE

TECHNICAL FIELD

The present invention relates to an ignition coil module comprising a coil system which includes a primary winding and a secondary winding as well as a flux conducting, soft magnetic device to increase and/or conduct a magnetic flux generated by one of the windings and comprising an electronic module to control the coil system which has an electric circuit and a heat sink to cool the electronic module.

BACKGROUND OF THE INVENTION

Ignition coil modules of the named kind are generally known and serve to generate ignition voltages, in response to a corresponding control, for the generation of a spark of a spark plug of a combustion engine, with the electronic component frequently being embedded in a plastic material which also surrounds parts of the coil system.

In its operation, the electronic component generates heat loss which has to be dissipated to avoid overheating. If the electronic component is not embedded, the heat must be dissipated via the ambient air within a housing of the ignition coil module. Such a dissipation of heat is, however, not very effective due to the low thermal conductivity of air.

Similar relationships also occur on embedding into plastic. Typical plastics used for embedding likewise have a low thermal conductivity. For instance an epoxy resin typically has a thermal conductivity in the range of, for example, approximately 0.5 W/m K.

An excessive heating of the electronic component can therefore easily occur, in particular with high engine speeds and/or high ambient temperatures, which can result in an impairment of the function of the electronic component and/or in a reduced service life of the electronic component and thus of the ignition coil module.

To avoid such an impairment of function, a separate cooling element of metal can be used by means of which the heat can be dissipated from the ignition coil module over a larger area. However, such a cooling element causes additional costs.

SUMMARY OF THE INVENTION

It is the underlying object of the present invention to provide an ignition coil module of the aforesaid kind in which heat generated by the electronic module is easily dissipated and which can, at the same time, be manufactured at a favorable cost.

The object is satisfied by an ignition coil module having the features of claim 1.

The ignition coil module in accordance with the invention includes an ignition coil system which includes a primary winding and a secondary winding as well as a flux conducting, soft magnetic device to increase and/or to conduct a magnetic flux generated by one of the windings and includes an electronic module to control the coil system which has an electric circuit and a heat sink to cool the electronic component. At least one section of the heat sink is connected in a thermally conductive manner to a section of the flux conducting device such that waste heat of the electronic component can be dissipated via the section of the flux conducting device.

The primary winding, which can be controlled directly or indirectly by the electronic module, serves to generate a magnetic field whose change induces ignition currents in the secondary winding. For this purpose, the secondary winding as a rule has a larger number of windings than the primary coil.

The flux conducting device, which can include one or more components and in particular a coil core, is formed from a soft magnetic material or from a ferromagnetic material of low hysteresis. It serves to increase the magnetic flux generated by the primary coil, which is in particular the case with a coil core, or to guide or conduct the magnetic flux, for example to avoid dissipation loss.

The soft magnetic materials can in particular be corresponding metals, for example iron, metal alloys or composite materials with high portions of corresponding metals or metal alloys which therefore have a substantially higher thermal conductivity than a plastic optionally surrounding the electronic component and/or one of the windings.

The electronic component which serves for the control of the coil system and can, for this purpose, be connected to an engine control or to breaker contacts, has a heat sink which serves for the dissipation away of heat from the electronic component and is made for this purpose of a metal which has a high thermal conductivity, i.e. one which is at least twice as high, in comparison with plastic materials. The heat sink is expediently made of metal.

For the better dissipation of the waste heat of the electronic component, at least one section of the heat sink is connected in a thermally conductive manner to a section of the flux conducting device. In the context of this invention, a thermally conductive connection is understood as an arrangement of the section of the heat sink and of the section of the flux conducting device in which they are either in direct contact or are only separated from one another by a layer of low thermal resistance. The thermal resistance should expediently be larger than that of a layer of approximately 1 mm thickness of a material having a thermal conductivity of approximately 0.5 W/m K.

Due to the thermal coupling of the section of the heat sink to the section of the flux conducting device, the latter can be used as a heat sink so that heat formed in the electronic component can be dissipated very easily via the thermally conductive connection to the flux conducting device. An overheating of the electronic component, and an accompanying reduction in the service life or an impairment of the function of the ignition coil module, can hereby be avoided. This is of substantial importance in particular for high performance ignition coils for engines with direct injection.

Since, furthermore, only devices already present for purposes of the flux conducting are used, no additional parts are required in the ignition coil module in accordance with the invention, whereby the costs to manufacture the ignition coil module in accordance with the invention can be kept low. In particular no additional components are necessary.

Further developments and preferred embodiments of the invention are described in the description, in the claims and in the drawings.

To obtain the best possible thermal coupling between the section of the heat sink and the section of the flux conducting device, it is preferred for the section of the heat sink and that of the flux conducting device to be of areal shape and to be arranged substantially parallel to one another. A particularly large heat flux between the heat sink and the flux conducting device, and thus between the electronic component and the flux conducting device is possible due to the areal design of the thermally conductive connection so that waste heat of the electronic component can be dissipated particularly effectively. The spacing of the sections is particularly preferably as low as possible in order to ensure the best possible heat transfer. The sections can in particular contact one another.

The flux conducting device can generally be made of different soft magnetic materials, In particular, composite materials with soft magnetic particles distributed therein can be used, with the matrix material usually being an electrical insulator, in particular a plastic, in order to suppress eddy currents occurring due to the changing magnetic fields of the coil. The thermal conductivity of the composite material is, however, not very high since the soft magnetic particles are connected by matrix regions with comparatively poor thermal conductivity. It is therefore preferred for the section of the flux conducting device connected to the heat sink to be made from a soft magnetic metal. The section of the flux conducting device then has a very high thermal conductivity so that a particularly good dissipation of heat is achieved.

The section of the heat sink can generally be connected to any desired components of the flux conducting device. With an embodiment of the ignition coil module in accordance with the invention, it is preferred for the flux conducting device to include a soft magnetic core which is at least partly surrounded by the primary winding and/or the secondary winding and to which the heat sink is connected in a thermally conductive manner.

The heat dissipation from the core to the ambient air of the ignition coil module is, however, frequently not very high, since the core is surrounded by the coils and, as a rule, by a housing. It is therefore preferred for the flux conducting device to include a core at least partly surrounded by the primary winding and/or the secondary winding and a soft magnetic jacket which at least partly surrounds the primary winding and the secondary winding and which forms a magnetic circuit with the core and is connected to the heat sink in a thermally conductive manner. The soft magnetic jacket does not necessarily have to contact the core to form the magnetic circuit. Furthermore, only a part of the magnetic flux generated by one of the windings or by the primary winding has to be led into the jacket so that this does not have to completely surround the windings. In particular, different portions of the magnetic flux can be led by optionally present further components of the flux conducting device. Furthermore, dissipation losses can also occur by flux portions outside the flux conducting device.

The use of such a jacket for the dissipation of heat is particularly effective since the jacket surrounds the windings, on the one hand, and is thus arranged close to the surface of the ignition coil module cooled by ambient air and since the jacket has a large area, on the other hand, via which a dissipation of heat is possible. Not only a very good dissipation of the heat from the electronic component to the jacket is thus ensured, but also a very good dissipation of the heat from the jacket, optionally via a housing wall of the ignition coil module in accordance with the invention, to the ambient air, with the jacket particularly preferably being made of a soft magnetic metal.

A region of the jacket can preferably be made by a lug extending non-tangentially to the primary winding and/or the secondary winding and projecting therefrom. Not only eddy current losses caused by the alignment are very low in this lug. Its surface, which can expediently be planar in design, furthermore provides a large region for a heat transfer from the heat sink to the jacket. In particular, a surface of the heat sink can directly contact the lug so that a large-area thermal contact with low thermal resistance is achieved. A particularly effective dissipation of heat from the electronic component thus results.

To achieve a small construction size, it is preferred for one of the windings to be at least partly surrounded by the other winding, with the primary winding being able to be arranged inside or outside the secondary winding depending on the design of the ignition coil module.

To reduce eddy current losses in the flux conducting device, and a heat load associated therewith, as much as possible, it is preferred for the flux conducting device to be made at least in part of a composite metal with a plastic matrix and soft magnetic particles embedded therein. Since the largest changes in the magnetic flux occur in the coil core, the coil core is particularly preferably made from such a composite metal.

Alternatively, to avoid eddy current losses, it is preferred for the core to be a laminated iron core whose lamination impairs the formation of eddy currents.

The flux conducting device of the ignition coil module in accordance with the invention can form a capacitance with a secondary winding or a secondary coil of the ignition coil module which can be charged with up to several hundred volts. To avoid any disturbances associated with this, the section of the flux conducting device which is connected to the heat sink can in particular be grounded.

It is additionally or alternatively preferred for the heat sink to be electrically insulated with respect to the electrical circuit. If, namely, the heat sink of the electronic component is formed by a drain or a collector of a driver transistor of the electronic component, the heat sink can conduct several hundred volts and should therefore be electrically insulated.

It is further preferred for the section of the heat sink connected to the section of the flux conducting device in a thermally conductive manner to be electrically insulated with respect to the flux conducting device. This insulation layer is preferably made from a material of high thermal conductivity and/or of a low layer thickness. With this embodiment, a grounding of the section of the flux conducting device can be avoided, with, however, at the same time protection of the electrical circuit against currents in the flux conducting device caused by induction, on the one hand, and a good dissipation of heat from the electronic component being achieved, on the other hand.

BRIEF DESCRIPTION OF THE DRAWINGS

The invention will be further explained in the following by way of example with reference to the drawings. There are shown.

DESCRIPTION OF THE PREFERRED EMBODIMENT

Figure 1:
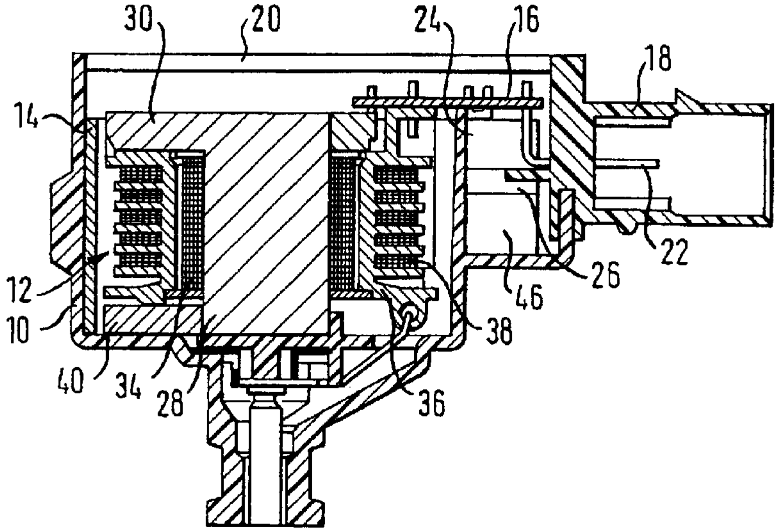
FIG. 1 is a schematic, part sectional view through an ignition coil module.

An ignition coil module in accordance with a preferred embodiment of the invention shown only partly in FIG. 1 has a housing pot 10, a coil system 12, a jacket 14 partly surrounding the coil system 12, a board 16 connected to the coil system 12, a plug-in connector receiver 18 held by the housing pot 10 and a housing lid 20.

The housing pot 10, which is produced from an impactable, high temperature resistant plastic, serves for the reception of the jacket 14, of the coil system 12 and of the board 16. It furthermore carries the plug-in connector reception 18 which forms part of the outer wall of the ignition coil module.

For protection against environmental influences, the interior of the housing pot 10 is covered by the housing lid 20.

Figure 2:
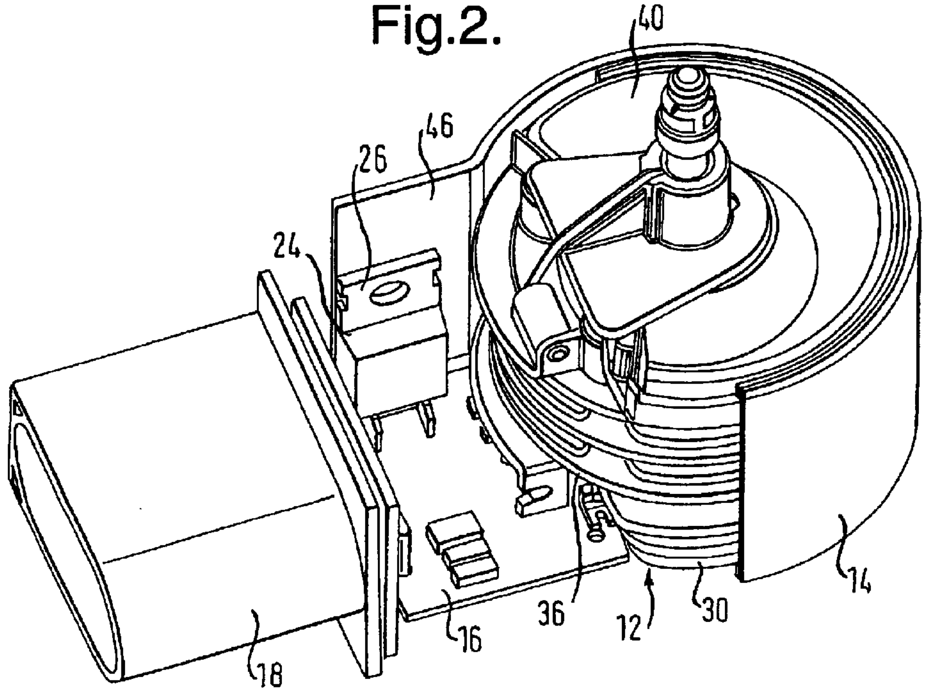
FIG. 2 is a perspective part view of the ignition coil module in FIG. 1.

The coil system 12, the jacket 14, the board 16 and the plug-in connector reception 18 are shown more precisely in FIG. 2.

The plug-in connector reception 18 services for the reception of a plug-in connector with feed lines for a power supply and control signals. For this purpose it has contact elements 22 which are connected to the board 16.

The board 16 carries an electronic component 24 to control the coil system 12 which is connected to the contact elements 22, to the coil system 12 and, optionally, to further components not shown in the Figures, via conductor tracks not shown in the Figures.

The electronic component 24 has an electrical circuit not shown in the Figures and a heat sink 26 formed by a metal plate which is embedded into the electronic component 24 close to the electrical circuit using an epoxy resin such that a good heat transfer is provided from the electrical circuit to the heat sink 26, but this is electrically insulated with respect to the electrical circuit.

Figure 3:
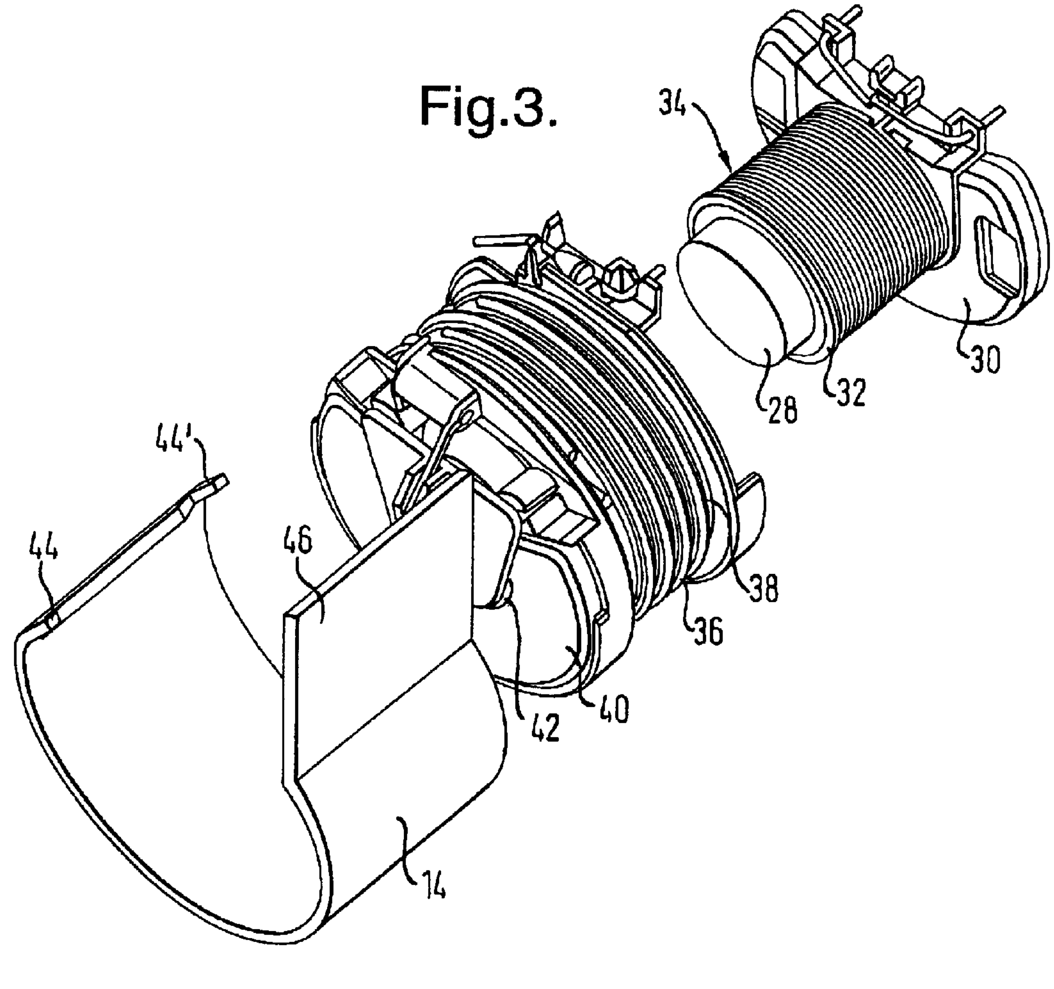
FIG. 3 is a schematic exploded representation of the coil system and of the jacket of the ignition coil module in FIG. 1.

The coil system 12, which is again shown in an exploded presentation in FIG. 3, includes a core 28 with a first pole plate 30 molded on, a first coil carrier 32 with a primary winding 34, a second coil carrier 36 with a secondary winding 38, and a second pole plate 40.

The substantially hollow cylindrical first coil carrier 32 with the primary winding 34 is pushed onto the cylindrical core 28.

The primary winding 34 is connected, not explicitly shown in the Figures, to the electronic component 34 via the board 16.

The second coil carrier 36, which carries the secondary winding 38, receives the core 28 with the first coil carrier 23 pushed onto it and with the primary winding 34. Connections of the secondary winding 38 are connected to electrodes not shown in the Figures for connection to the electrical contacts of spark plugs.

The second pole plate 40 has a recess 42 at its center which receives a section of the core 28 projecting beyond the first coil carrier 32 (cf. also FIG. 1).

The core 28 with the first pole plate 30 molded on and the second pole plate 40 are formed as molded parts from a soft magnetic composite material with a plastic matrix and soft magnetic particles of a corresponding iron alloy embedded therein.

The jacket 14 consists of a soft magnetic iron alloy or steel alloy, for example of the soft magnetic steel alloy with the designation AISI 1008 which has a thermal conductivity of 58 W/m K. It is substantially formed as a hollow cylinder segment with two securing tongues 44 and 44' at a longitudinal side and a lug 46 molded on at the other elongate side of the jacket.

The jacket 14 surrounds the coil system 12 including the first and second pole plates 30 and 40 respectively.

The first pole plate 30 carries the board 16, with the jacket 14, and in particular its lug 46, being formed and being arranged relative to the electronic component 24, or its heat sink 26, such that the heat sink 26 areally contacts the lug 46.

The core 28 with the first pole plate 30 molded on, the jacket 14 and the second pole plate 40 form a magnetic circuit. If a current flows through the primary winding 34, a magnetic flux is induced in the magnetic circuit or conducted therein. The jacket 14 serves in particular for the return of at least some of the magnetic flux from one of the pole plates 30 or 40 respectively to the other pole plate. Changes in the magnetic flux then induce an ignition voltage in the secondary winding 38 which is elevated with respect to the voltage applied to the primary winding 34 and which can be supplied to corresponding contacts of a spark plug.

In accordance with the invention, the jacket 14, and in particular its lug 46, serves for the dissipation of heat which is generated by the electrical circuit in the electronic component 24 in operation of the ignition coil module. The heat generated by the electrical circuit is initially transferred to the heat sink 26 and is then transferred, due to its higher thermal conductivity, into the region of the lug 46.

The heat then flows from the section of the heat sink 26 thermally connected to the lug 46 into the lug 46 and from there into the jacket 14, with the thermal resistance between the heat sink 26 and the lug 46 being very low since the heat sink areally contacts the lug 46 directly.

The heat in the jacket 14 can then be dissipated via the very large outer surface of the jacket 14 via the housing pot 10 to the ambient air.

To avoid the build up of a capacitance between the jacket 14 and the secondary winding 38, which could be charged with several hundreds of volts, the jacket 14 can preferably be grounded.

With another embodiment of the present invention, the jacket 14 is omitted and the core 28 is formed as a laminated iron core. In this case, the electronic component is arranged such that the section of the heat sink 26 exiting the electronic component 24 contacts the laminated coil core areally which can then serve as a heat sink.

A very cost favorable and, at the same time, effective dissipation of the waste heat is achieved by the use in accordance with the invention of the magnetic flux conducting devices of the ignition coil module for the heat dissipation of the waste heat of the electronic component so that an increased service life of the ignition coil module results with, at the same time, a high performance.

What is claimed is:

1. An ignition coil module comprising a coil system which includes a primary winding and a secondary winding as well as a flux conducting, soft magnetic device to increase and/or to conduct a magnetic flux generated by one of the windings; and an electronic component to control the coil system which has an electrical circuit and a heat sink to cool the electronic component, characterized in that at least one section of the heat sink is connected to a section of the flux conducting device in a thermally conductive manner such that waste heat of the electronic component can be dissipated away via the section of the flux conducting device.

2. An ignition coil module in accordance with claim 1, characterized in that the section of the heat sink and that of the flux conducting device are of areal shape and are arranged substantially parallel to one another.

3. An ignition coil module in accordance with claim 1, characterized in that the section of the flux conducting device connected to the heat sink is made of a soft magnetic metal.

4. An ignition coil module in accordance with claim 1, characterized in that the heat sink is insulated with respect to the electrical circuit.

5. An ignition coil module in accordance with claim 1, characterized in that the flux conducting device includes a core at least partly surrounded by the primary winding and/or the secondary winding and a soft magnetic jacket which at least partly surrounds the windings, forms a magnetic circuit with the core and is connected to the heat sink in a thermally conductive manner.

6. An ignition coil in accordance with claim 5, characterized in that a region of the jacket is formed by a lug extending non-tangentially to the primary winding and/or the secondary winding and projecting from this.

7. An ignition coil module in accordance with claim 1, characterized in that one of the windings is at least partly surrounded by the other winding.

8. An ignition coil module in accordance with claim 1, characterized in that the flux conducting device is formed at least in part from a composite material with a plastic matrix and soft magnetic particles embedded therein.

9. An ignition coil module in accordance with claim 1, characterized in that the section of the heat sink connected to the section of the flux conducting device in a thermally conductive manner is electrically insulated with respect to the flux conducting device.

10. An ignition coil module in accordance with claim 1, characterized in that the flux conducting device includes a soft magnetic core which is at least partly surrounded by the primary winding and/or the secondary winding and to which the heat sink is connected in a thermally conductive manner.

11. An ignition coil module in accordance with claim 4, characterized in that the core is a laminated iron core.

* * * * *